United States Patent [19]
Kobayashi et al.

[11] Patent Number: 4,685,206
[45] Date of Patent: Aug. 11, 1987

[54] POSITIONING APPARATUS FOR A CIRCULAR SUBSTRATE

[75] Inventors: Jiro Kobayashi, Yamato; Koichi Yoshikawa, Chiba, both of Japan

[73] Assignee: Nippon Kogaku K. K., Tokyo, Japan

[21] Appl. No.: 803,437

[22] Filed: Dec. 2, 1985

[30] Foreign Application Priority Data

Dec. 5, 1984 [JP] Japan ............................. 59-256922

[51] Int. Cl.⁴ ............................................ B23P 19/00
[52] U.S. Cl. ..................................... 29/740; 198/394; 414/779
[58] Field of Search ........................ 198/394; 414/779; 29/740

[56] References Cited

U.S. PATENT DOCUMENTS 4,024,944  5/1977  Adams et al. .................. 198/394
4,483,434  11/1984  Miwa et al. ..................... 198/394

FOREIGN PATENT DOCUMENTS 58-18713  3/1983  Japan .

OTHER PUBLICATIONS

Vol. 18, No. 11, IBM Technical Disclosure Bulletin, pp. 3625 and 3626, Apr. 1976.

Primary Examiner—Lowell A. Larson
Attorney, Agent, or Firm—Shapiro and Shapiro

[57] ABSTRACT

A positioning apparatus for positioning a circular substrate having a notch in a circumferential edge includes a notch sensor which senses the rotational position of the substrate about a center axis, a pushing member adapted to fit into the notch and moved toward the center axis to displace the substrate so as to engage positioning elements, and a detector that detects the fitting of the pushing member in the notch, the detector being movable with the pushing member.

6 Claims, 10 Drawing Figures

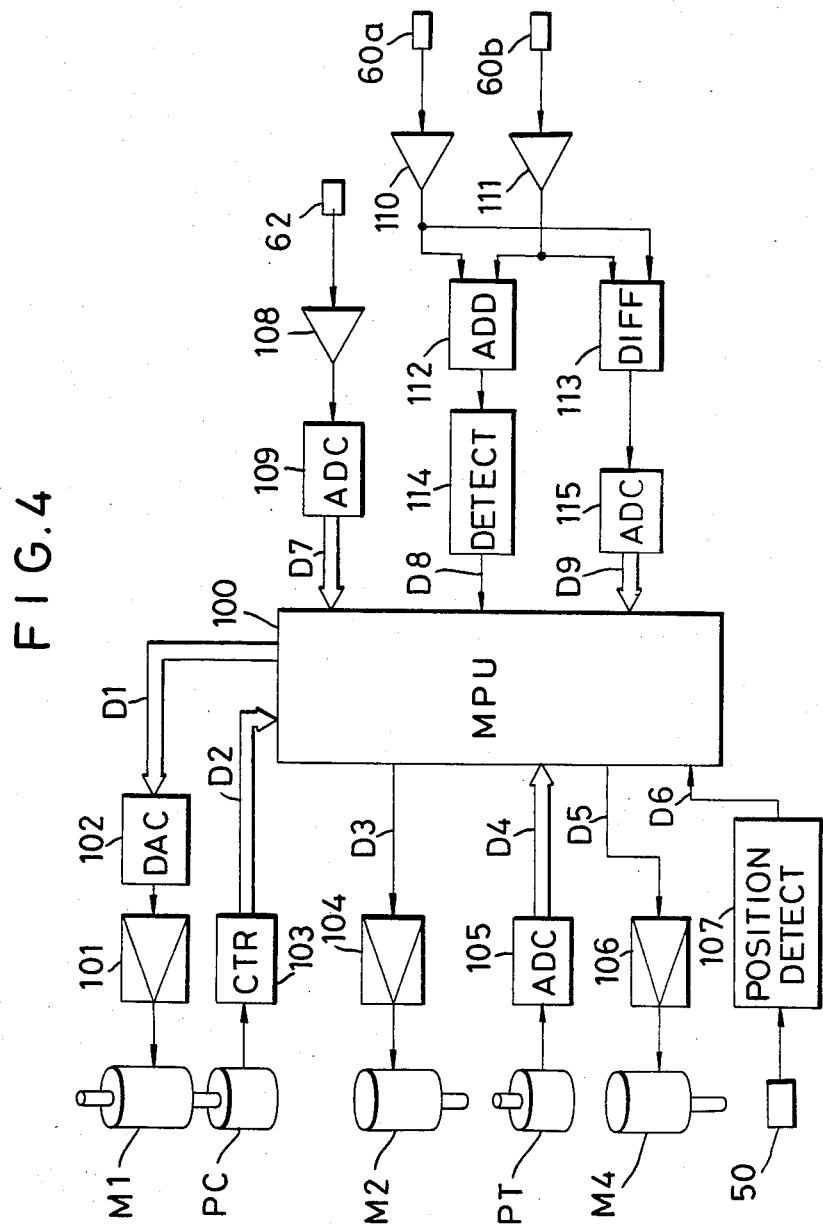

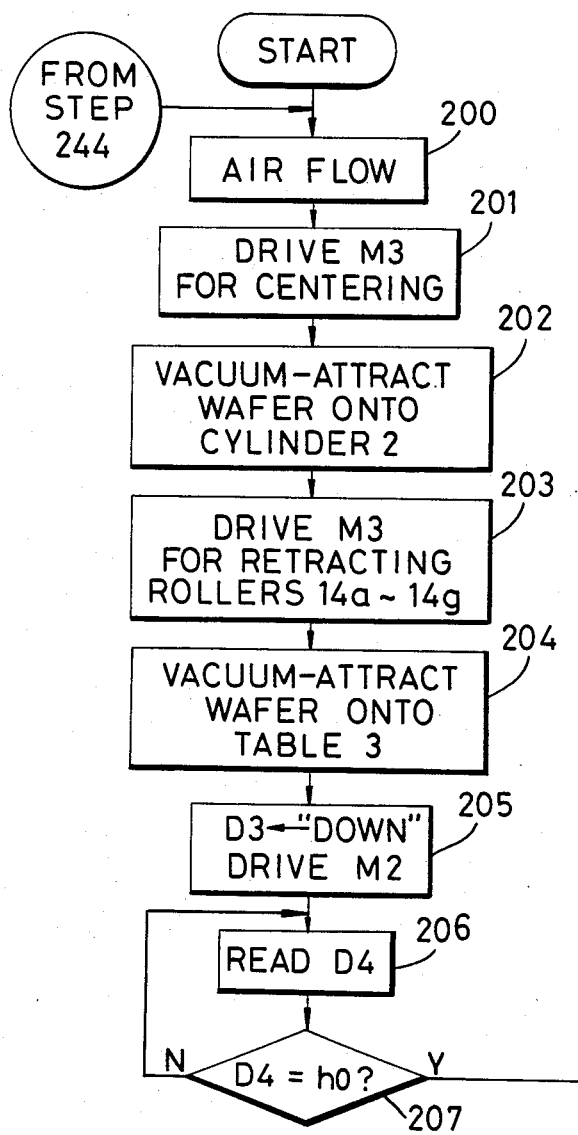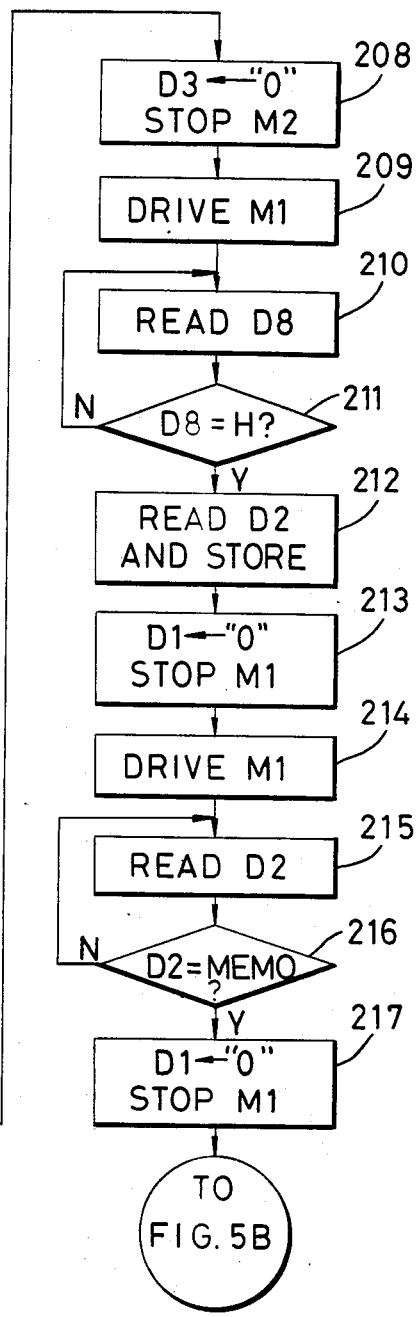
FIG. 5A

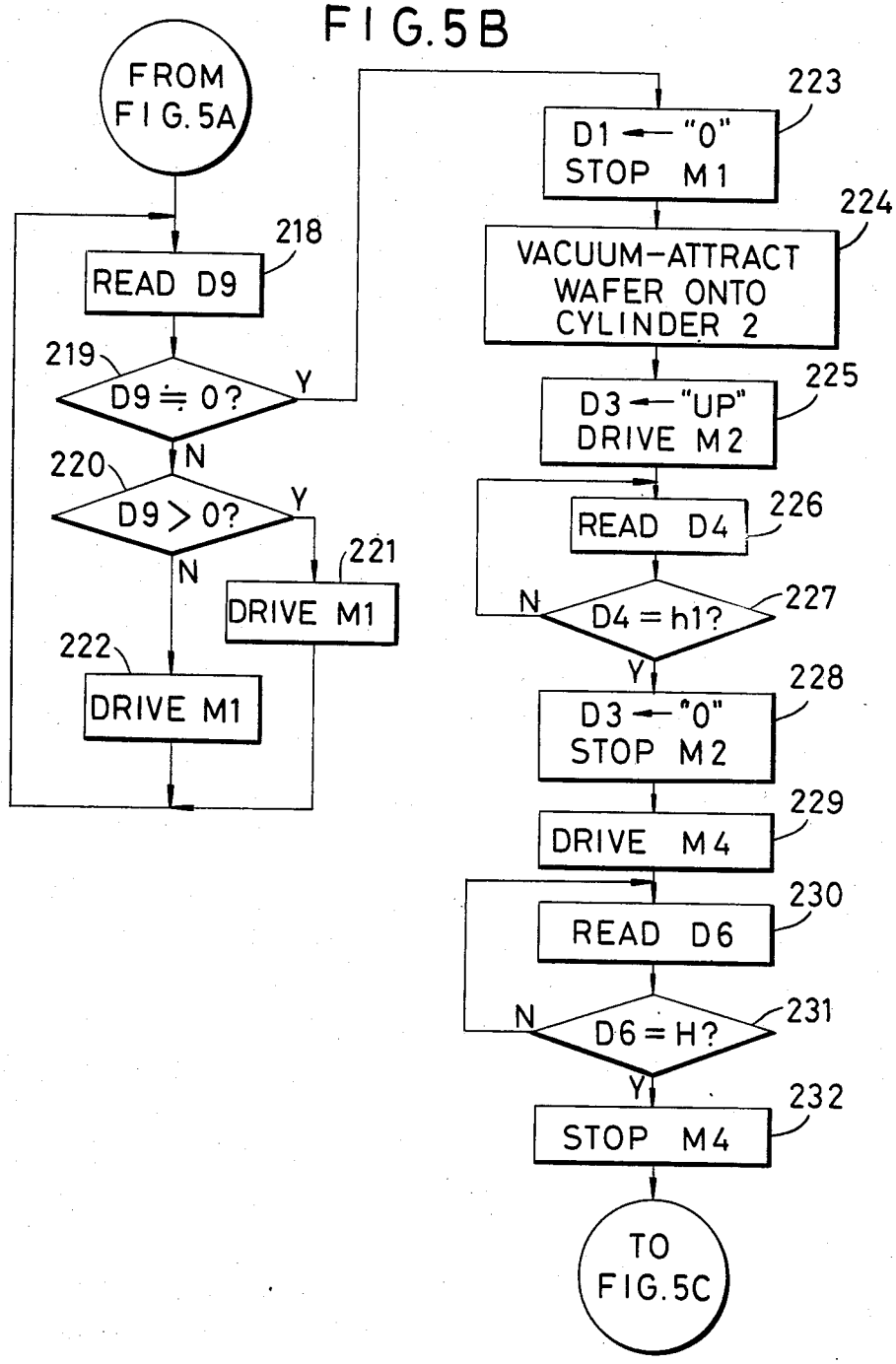

POSITIONING APPARATUS FOR A CIRCULAR SUBSTRATE

BACKGROUND OF THE INVENTION

1. Field of the Invention

The present invention relates to a positioning apparatus for a circular substrate such as a semiconductor wafer.

2. Description of the Prior Art

Many wafers for manufacturing semiconductor devices have flats formed by linearly cutting off portions of circumferences thereof in order to indicate crystal orientations. When the wafers are mounted on a fabrication machine or a test machine, the flats are usually used to position the wafers (or to eliminate a rotational error and an x-y axes error). One technique to position a wafer by using a flat on the wafer is shown in Japanese Unexamined Patent Publication No. 18713/1983. Recently, as the scale of the wafer is increased, the use of an 8-inch wafer which is larger than a commonly used 6-inch wafer is being considered. In order to mechnically position the 8-inch wafer by using the flat with a high accuracy, a fairly long flat is required. In other words, an area which is cut off to prepare the flat is fairly large. Since a certain number of semiconductor chips could be formed on the cut-off area, it is not advantageous to form a long flat in a large size wafer for the purpose of effectively fabricating a number of chips on the wafer. It has been proposed to fabricate more chips by forming a V-shaped or U-shaped notch in the periphery of the wafer. However, many of the existing wafer positioning apparatus can position a wafer with a flat but cannot position a wafer with a notch.

When a wafer with a notch is to be positioned, the notch must be oriented in a predetermined orientation. The notch is usually much smaller than the cut-off area of the flat and hence it is difficult to precisely detect the notch. Accordingly, even if the wafer is rotated to detect the predetermined orientation of the notch and the wafer is stopped at that position and fixed to the apparatus, the notch position at which the wafer is stopped is not accurate and the wafer is not exactly positioned.

SUMMARY OF THE INVENTION

It is an object of the present invention to provide a positioning apparatus which can position a wafer with a notch with a high accuracy.

The positioning apparatus of the present invention comprises rotation positioning means for rotating a circular substrate having a notch in a periphery thereof and stopping the rotation of the substrate when the notch aligns to a predetermined position, a pushing member movable toward a center of the substrate to fit to the notch at the predetermined position, a reference member for engaging with the periphery of the substrate pushed by the pushing member to position the substrate, and discrimination means for discriminating a first status in which the pushing member fits to the notch and a second status in which the pushing member engages with the periphery other than the notch.

The circular substrate to be positioned by the present positioning apparatus may include a semiconductor wafer and a mask for an X-ray exposure.

BRIEF DESCRIPTION OF THE DRAWINGS

FIG. 4 is a block diagram of a control circuit in the embodiment, FIGS. 5A, 5B and 5C show overall flow charts for illustrating the operation of the embodiment.

DESCRIPTION OF THE PREFERRED EMBODIMENTS

Figure 1:
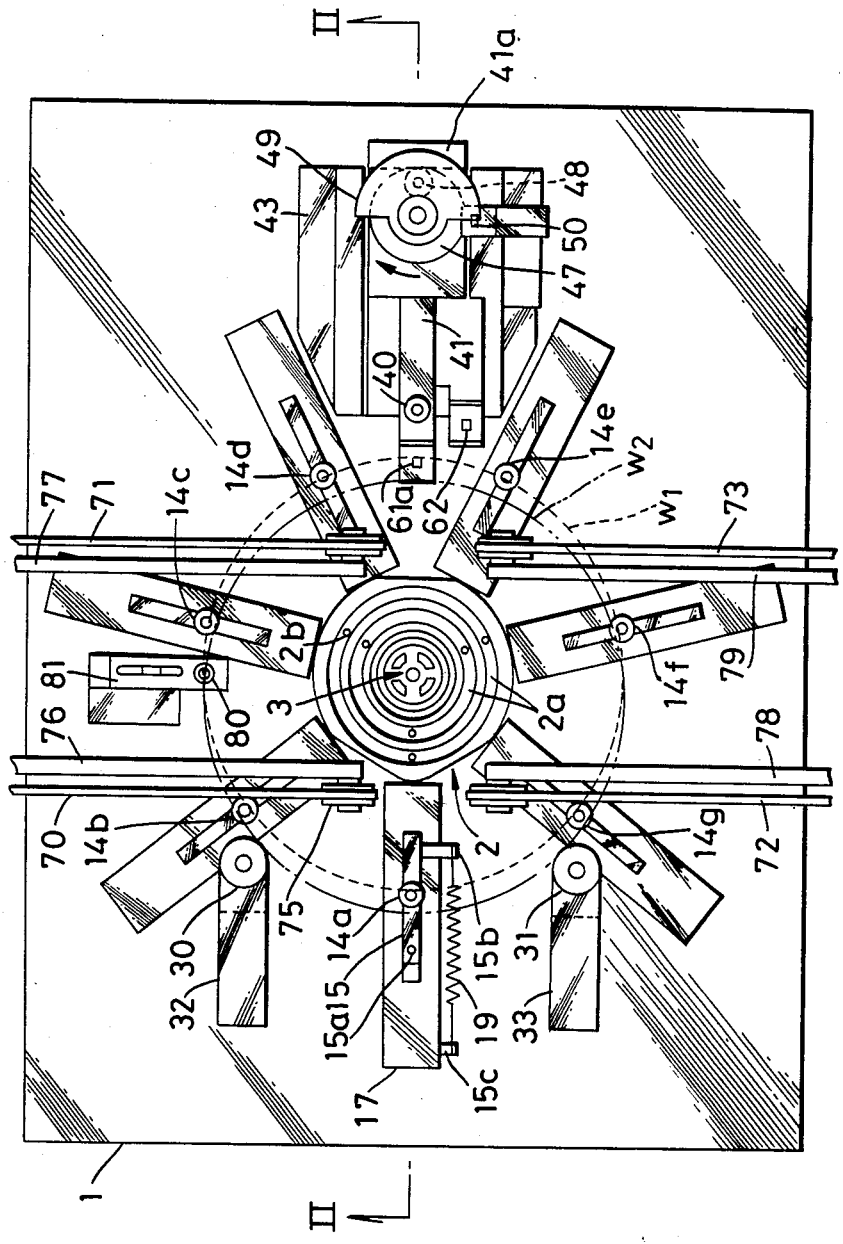
FIG. 1 is a plan view of one embodiment of the positioning apparatus of the present invention.
Figure 2:
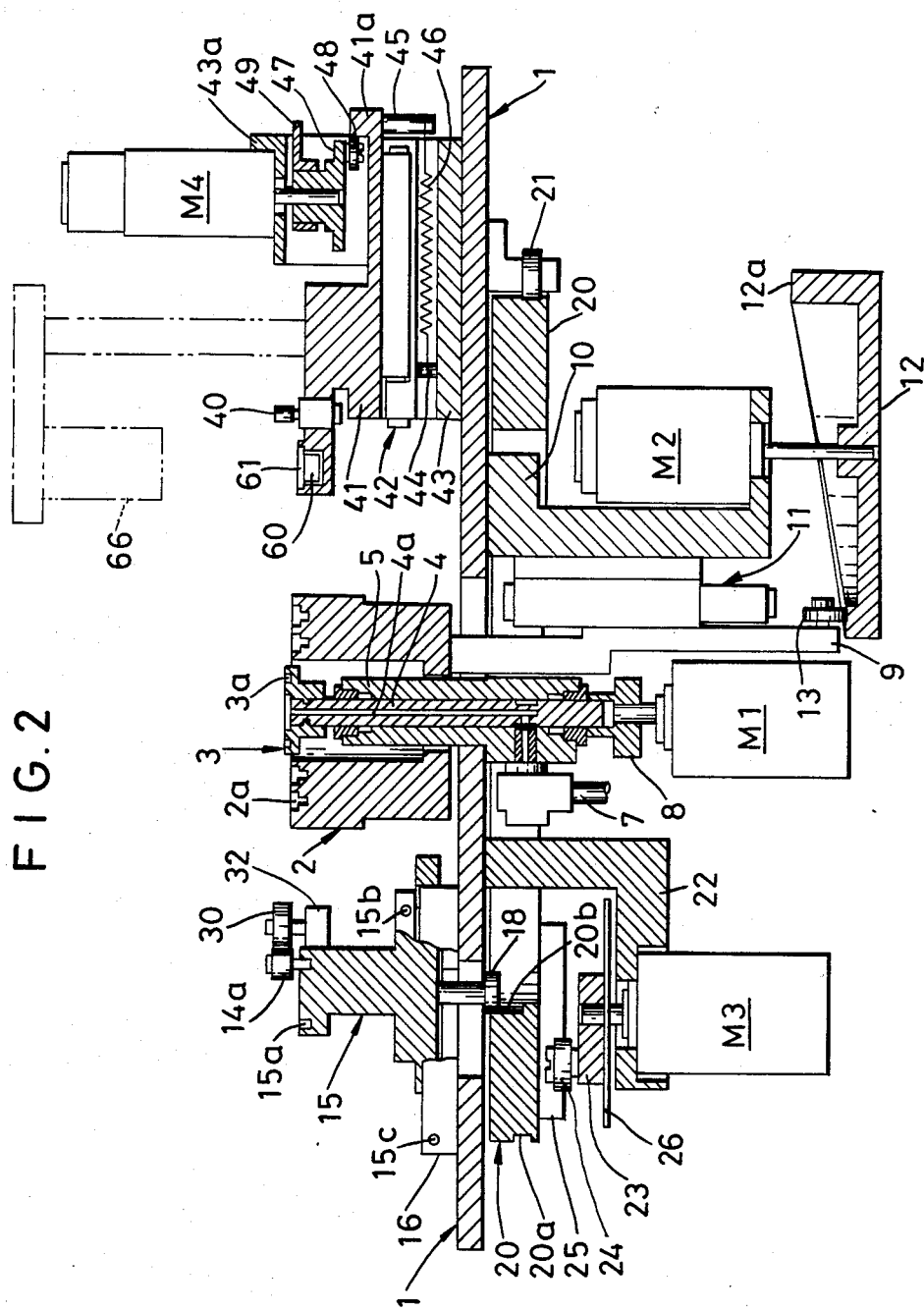
FIG. 2 is a sectional view of FIG. 1 as viewed along a line II—II.

FIGS. 1 and 2 show one embodiment of the positioning apparatus of the present invention. The apparatus is assembled on a rectangular base plate 1. A cylinder member 2 having a ring-shaped mount plane on which a wafer is to be mounted is vertically movably mounted at a center of the base plate 1. Concentric grooves 2a are formed in the mount plane of the cylinder member 2. Air suction/exhaust holes 2b for vacuum-sucking and air-floating the wafer are formed in the grooves 2a. A rotary table 3 is concentrically arranged inside the cylinder member 2 and vacuum-sucking holes 3a are formed in a top surface of the rotary table 3. As shown in FIG. 2, the rotary table 3 is fixed to a rotary shaft 4 mounted along a center axis of a suction hole 4a, and the rotary shaft 4 is rotatably supported by a bearing 5 which is fixed to the base plate 1.

A groove is formed in a circumference of the rotary shaft 4 at a bottom thereof and the groove communicates with the suction hole 4a in the rotary shaft 4. A joint 7 for connecting a pipe extending from a vacuum source is mounted on the bearing 5, and the joint 7 communicates with the groove at the bottom of the rotary shaft 4 through a hole formed in the bearing 5. Thus, even in the rotation status of the rotary shaft 4, the wafer can be sucked through the suction hole 4a and the groove 3a of the rotary table 3.

The rotary table 3 is rotated by a motor $M_1$ mechanically coupled (directly coupled) to the bottom of the rotary shaft 4 through the joint 8. The motor $M_1$ is mounted on a mount which is fixed to the base plate 1.

A transmission member 9 which extends downward along the bearing 5 is fixed to the bottom of the cylinder member 2, and the transmission member 9 is vertically movably supported by a ball slider 11 mounted on a mount 10 which is fixed to the bottom of the base plate 1. The transmission member 9 is normally biased downward by a spring, not shown. A motor $M_2$ is downwardly fixed to the mount 10 and a shaft of the motor is directly coupled to a cylindrical cam member 12. A roller 13 pivoted at the bottom of the transmission member 9 abuts against a cam surface 12a at the top of the cam member 12. Accordingly, as the cam member 12 rotates, the transmission member 9 and the cylinder member 2 move vertically in unison.

FIG. 2 shows the lowermost position of the cylinder member 2. The top surface of the cylinder member 2 is lower than the top surface of the rotary table 3. If the cam member 12 rotates one half revolution from this position, the top surface of the cylinder member 2 is higher than the top surface of the rotary table 3. A potentiometer, not shown, for measuring the rotation position of the cam member 12 is provided to indirectly detect the vertical position of the cylinder member 2.

As shown in FIG. 1, seven linearly movable rollers 14a, 14b, 14c, 14d, 14e, 14f and 14g are arranged at an equal angular interval radially from the center of rotation of the rotary table 3 on the periphery of the cylinder member 2. The seven rollers 14a–14g are used to position or center the center of rotation of the rotary table 3 to the center of the wafer. They are identical and move radially while keeping the same distance from the center of rotation of the rotary table 3 to each of the seven rollers 14a–14g. Since the moving mechanisms of the seven rollers are identical, only the moving mechanism of the roller 14a is explained.

The roller 14a is rotatably pivoted to a hold member 15 such that it is positioned at substantially the same level as the mount plane of the rotary table 3. The hold member 15 is supported by a slider base 16 fixed to the base plate 1, and radially movable.

A shaft which extends through the base plate 1 is fixed to the bottom of the hold member 15 and a roller 18 is rotatably supported by the shaft. A spring 19 spans between a pin 15b mounted on the hold member 15 and a pin 15c mounted on the slider base 16, and the spring 19 is normally biased to keep the hold member 15 away from the center of rotation of the rotary table 3.

A ring-shaped cam plate 20 which is rotatable around the center of rotation of the rotary table 3 is arranged under the base plate 1. A groove 20a is formed in an outer periphery of the cam plate 20. Rollers 21 are arranged at a plurality of (at least three) positions on the periphery of the cam plate 20 and rotatably pivoted to the base plate 1. Accordingly, the cam plate 20 is suspended to the base plate 1 by the rollers 21 and guided by the rollers 21 to be rotatable coaxially with the center of rotation of the rotary table 3.

A cam surface 20b which abuts against the roller 18 of the hold member 15 is formed in an inner peripheral surface of the cam plate 20. The cam surface 20b has a radial lift for radially moving the roller 18 as the cam plate 20 is rotated. As a result, as the cam plate 20 is rotated, the centering roller 14a is radially moved.

The cam surface 20b has portions formed at an angular interval which is one seventh of the inner peripheral surface of the cam plate 20 so that they equally function to the centering structures for the other rollers 14b–14g. In FIGS. 1 or 2, the centering rollers 14a–14g are at the closest positions to the rotary table 3. Under those positions, a circle which passes through the abutting points of the seven rollers 14a–14g to the circumferential edge of a wafer has a slightly smaller diameter than a diameter of a wafer $W_1$ after centering as shown by a broken line in FIG. 1.

The cam plate 20 is biased by a spring in a clockwise or counterclockwise direction so that the seven rollers 14a–14g normally move toward the rotary table 3 against the biasing force of the springs 19.

The cam plate 20 is rotated by a motor $M_3$ mounted on a mount 22 fixed to the bottom of the base plate 1. A disk 23 is eccentrically fixed to the shaft of the motor $M_3$, and a roller 24 rotatably supported off the motor shaft is mounted on the disk 23.

The roller 24 rolls on an abutting surface of a guide member 25 fixed to the lower surface of the cam plate 20 as the motor $M_3$ rotates. The abutting surface of the guide member 25 essentially extends radially from the center of rotation of the cam plate 20 and normally abuts against the roller 24 by the biasing force of the spring which biases the cam plate 20 in one rotating direction.

Immediately after the centering of the wafer, the roller 24 is spaced from the abutting surface of the guide member 25 by the rotation of the motor $M_3$ because the positions of the rollers 14a–14g are defined by the shape of the wafer $W_1$. Thus, the forces of the seven rollers 14a–14g to press the circumferential edge of the wafer $W_1$ toward the center thereof depends on a difference between the biasing force of the spring which biases the rotation of the cam plate 20 and the biasing force of the springs 19.

A semi-circular timing plate 26 for detecting the eccentric rotation position of the roller 24 is coaxially fixed to the shaft of the motor $M_3$. It photo-electrically detects the eccentric rotation position by a photo-coupler, not shown.

In FIGS. 1 and 2, a hole 15a is formed at the top of the hold member 15 to allow shifting of the roller 14a in case the wafer diameter changes. In the present embodiment, two wafers of different diameters can be equally centered.

A structure for finally positioning the wafer will now be explained. The wafer is finally pushed from the position of the centered wafer $W_1$ to the position of the wafer $W_2$ shown by a chain line of FIG. 1 and positioned by the two reference rollers 30 and 31 which abut against the circumferential edge of the wafer. The reference rollers 30 and 31 are rotatably supported by support members 32 and 33 fixed to the base plate 1.

The pushing of the wafer is done by a pushing roller 40 arranged on the opposite side of the reference rollers 30 and 31 with respect to the center of the wafer $W_1$. The pushing roller 40 has such a diameter that it can be fitted in the notch of the wafer. The pushing roller 40 is rotatably mounted on a slide member 41 which is radially movable from the center of the wafer (center of rotation of the rotary table 3), and the slide member 41 is mounted on a mount 43 through a ball slider 42 as shown in FIG. 2. The mount 43 is fixed to the base plate 1.

A pin 44 is formed on the mount member 43, and a pin 45 is formed on the slide member 41. A spring 46 is spanned between the pins 44 and 45. The spring 46 generates a force (pushing force to the wafer) for normally biasing the slide member 41 toward the center of rotation of the rotary table 3.

The linear movement of the slide member 41 is effected by a motor $M_4$ which is fixed to a motor mount 43a which is integral with the mount member 43. A disk 47 is coaxially fixed to a shaft of the motor $M_4$, and a roller 48 is rotatably pivoted at an eccentric position on the lower surface of the disk plate 47. The roller 48 normally abuts against a cam surface of cam 41a of the slide member 41 by the biasing force of spring 46.

In FIGS. 1 and 2, the slide member 41 (pushing roller 40) is at the farthest position from the rotary table 3. A semi-circular timing plate 49 for detecting the revolution position of the roller 48 is coaxially mounted on the disk 47. The rotation position of the timing plate 49 is photo-electrically detected by a sensor 50 such as a photo-coupler fixed to the mount member 43.

A photo-electric sensor 60 is arranged at an end of the slide member 41 to move into one side of the periphery of the centered wafer $W_1$. A mask plate 61 is mounted on a photo-sensitive plane of the photoelectric sensor 60. A small rectangular aperture 61a having substantially the same size as that of the notch of the wafer is formed in the mask plate 61. The aperture 61a is arranged such that an entire area is hidden at one side of the circumferential edge of the wafer $W_1$ when the slide member 41 is at the rearmost position. A line connecting the aperture 61a and the pushing roller 40 is parallel (or coincident) with the path of the linear movement of the slide member 41.

A photo-electric sensor 62 with an aperture for detecting the fitting of the pushing roller 40 into the notch of the wafer is arranged at substantially the same level as the aperture 61a with a predetermined positional relationship with the pushing roller 40 (see FIG. 1). The photo-electric sensor 62 linearly moves to go into one side of the circumferential edge of the wafer together with the slide member 41.

A light source device 66 for irradiating a collimated light flux to the photo-sensor 60 is arranged on the mount member 43. The light source device 66 includes a light source such as an LED lamp and a lens for collimating the light emitted thereby. The light source device is upwardly spaced from the aperture 61a such that an optical axis coincides with the aperture 61a when the slide member 41 is at the rearmost position. A light source device of a similar structure is arranged above the photo-electric sensor 62.

The wafer is transported by belts 70, 71, 72 and 73 shown in FIG. 1. Those belts are spanned on pulleys 75 which are pivoted at ends of guides 76, 77, 78 and 79. A photo-electric sensor 80 for detecting whether the wafer is above the cylinder member 2 or not is arranged in the transport path of the wafer. The photo-electric sensor 80 is fixed to the base plate 1 through a mount member 81 so that it is positioned immediately below the wafer under transportation.

The arrangement of the pushing roller 40, the photo-electric sensor 60 and the photo-electric sensor 62 is explained with reference to FIG. 3.

Figure 3A:
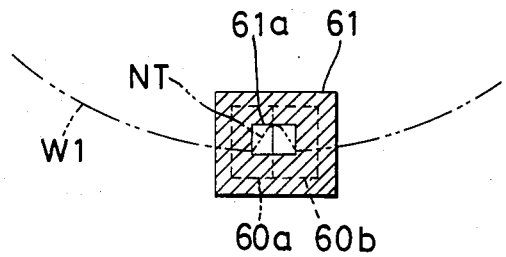
FIG. 3A is a plan view of a photo-electric sensor for detecting a notch.

FIG. 3A shows a specific shape of the photo-electric sensor 60. The circumferential edge of the centered wafer $W_1$ is positioned to cover substantially the entire area of the aperture 61a, but when the V-shaped notch NT comes into the aperture 61a, the light from the light source is irradiated to the aperture 61a. The photo-electric sensor 60 has two coplanar photo-electric elements 60a and 60b which are arranged to equally divide the notch NT. Thus, by rotating the centered wafer $W_1$ and checking if the photo-electric signals of the photoelectric elements 60a and 60b are larger than a predetermined level and equal to each other, it is possible to detect whether the notch NT is above the aperture 61a or not.

Figure 3B:
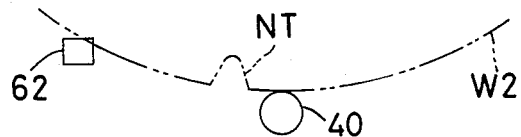
FIGS. 3B and 3C are plan views of a checking photo-electric sensor and a pushing roller, respectively.
Figure 3C:
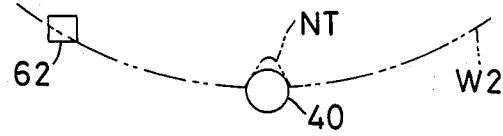

FIGS. 3B and 3C show arrangements of the pushing roller 40 and the photo-electric sensor 62. As shown in FIG. 3B, if the pushing roller 40 pushes the wafer to abut against the rollers 30 and 31 (FIG. 1) and the pushing roller 40 does not fit into the notch NT, most portions of the photo-electric sensor 62 are beyond the circumferential edge of the wafer $W_2$. On the other hand, if the pushing roller 40 fits into the notch NT, most portions of the photo-electric sensor 62 are covered by the circumferential edge of the wafer $W_2$ as shown in FIG. 3C. Accordingly, in the final positioning stage of pushing the wafer, it is possible to check whether the exact positioning has been done or not by examining the magnitude of the photo-electric signal of the photoelectric sensor 62.

Referring to FIG. 4, a control system of the present embodiment is explained. The overall operation is controlled by a stored program type digital processor 100 such as a microcomputer (MPU). The direction of rotation and the velocity of the motor $M_1$ which drives the rotary table 3 are controlled by a drive circuit 101 in response to an output from a digital-analog converter (DAC) 102 which converts a digital data $D_1$ from the MPU 100 to an analog voltage. A pulse converter PC is directly coupled to the motor $M_1$. It supplies to a counter 103 a pulse train 103 which produces one pulse for each unit angle rotation of the motor $M_1$. The counter 103 counts the number of the pulses in the pulse train and supplies to the MPU a digital value $D_2$ representative of the rotation angle of the motor $M_1$ (or the rotary table 3). The counter 103 counts the pulses up or down depending on the direction of rotation of the motor $M_1$.

The motor $M_2$ which vertically moves the cylinder member 2 is driven by a drive circuit 104 in response to a data $D_3$ from the MPU. A potentiometer PT is directly coupled to the motor $M_2$ and information representative of the rotation position of the motor $M_2$ is converted to a digital signal $D_4$ by an analog-digital converter (DAC) 105, and the digital signal $D_4$ is supplied to the MPU. The motor $M_4$ for driving the pushing roller 40 is driven by a drive circuit 106 in response to a digital data $D_5$ supplied from the MPU. The photo-electric signal of the photoelectric sensor 50 for detecting the position of the pushing roller 40 or the rotation position of the motor $M_4$ is supplied to a position detection circuit 107, which, in response to the photo-electric signal, produces a digital signal $D_6$ which alternately assumes logical values "L" and "H" for every one-half revolution of the timing plate 49. The position detection circuit 107 may be an ADC, in which case the digital signal $D_6$ corresponds to the magnitude of the photo-electric signal supplied from the photo-electric sensor 50 which binarily changes as the timing plate 49 rotates.

The photo-electric signal from the photo-electric sensor 62 is amplified by an amplifier 108, an output of which is converted to a digital signal $D_7$ by an ADC 109, and the digital signal $D_7$ is supplied to the MPU. The photo-electric signals from the two photo-electric elements 60a and 60b are amplified by amplifiers 110 and 111, respectively, and outputs therefrom are supplied to an adder 112 and a subtractor 113. The adder 112 adds the two analog photo-electric signals and supplies a sum to a detection circuit 114, which produces a digital signal $D_8$ which a logical value "H" when the sum is higher than a predetermined level (reference voltage), and a logical value "L" when the sum is lower. The detection circuit 114 detects a peak position on a waveform of the sum photo-electric signal and produces a digital signal $D_8$ which has the logical value "H" at the peak position and the logical value "L" at other lower level positions. On the other hand, the subtractor 113 produces an analog signal representative of a difference between the two photo-electric signals from the amplifiers 110 and 111 and supplies the analog difference signal to an ADC 115, which converts the analog signal to a digital signal $D_9$ and supplies it to the MPU. The MPU also controls the drives of the centering motor $M_3$ and the belts 70 to 73. The adder 112 may be omitted so that the photo-electric signal from one of the amplifiers 110 and 111 is applied to the detection circuit 114.

In the present embodiment, the rotation positioning means comprises the pulse converter PC, photo-electric sensor 60, drive circuit 101, DAC 102, counter 103, amplifiers 110 and 111, adder 112, subtractor 113, detection circuit 114 and DAC 115. The discrimination means of the present embodiment comprises the photoelectric sensor 62, amplifier 108 and ADC 109, and the control means comprises the slide member 41, roller 48, motor M4, spring 46 and drive circuit 106.

The operation of the circuit of FIG. 4 as well as the operation of the overall apparatus are explained with reference to the flow chart of FIG. 5. The transportation of the wafer by the belts 70-73 and the detection of the wafer position by the photo-electric sensor 80 are well known and explanation thereof is omitted. The wafer transported by the belts 70-73 is positioned above the cylinder member 2. The mount surface of the cylinder member 2 is, at this moment, slightly (for example, approximately 0.5-1 mm ) higher than the mount surface of the rotary table 3. The height of the cylinder member 2 at this position is represented by $h_1$. The guides 76-79 which hold the belts 70-73 then move down so that the wafer on the belts 70-73 is delivered onto the cylinder member 2. Under this position, the MPU 100 is in a step 200 in which gas (air or nitrogen) is injected from the suction/exhaust hole 2b to the mount plane of the cylinder member 2 to slightly float the wafer from the mount surface.

In a step 201, the MPU causes the motor $M_3$ to be rotated so that the centering rollers 14a-14g are moved toward the center of the wafer. The motor $M_3$ is stopped at the one-half revolution position of the eccentric disk 23. At this position, the wafer is peripherally pressed by the rollers 14a-14g against the biasing forces of the springs 19 so that the center of the wafer coincides with the center of rotation of the rotary table 3.

At the one-half revolution position of the motor $M_3$, the flow operation of the cylinder member 2 is stopped in a step 202, and a vacuum suction operation is started. As a result, the wafer is sucked while it is centered to the cylinder member 2. In a step 203, the motor $M_3$ is rotated by one-half revolution so that the rollers 14a-14g are retracted from the circumferential edge of the wafer. In a step 204, the vacuum suction operation of the mount surface of the rotary table 3 starts and the suction operation by the cylinder member 2 is released. In a step 205, the MPU supplies the digital data $D_3$ "DOWN" to the drive circuit 104 to move down the cylinder member 2. Thus, the motor $M_2$ starts to be rotated. The MPU then reads in the digital data $D_4$ in a step 206, and in a step 207, it checks if $D_4$ corresponds to a height $h_0$ of the cylinder member 2. If the decision in the step 207 is NO, the same operation is repeated from the step 206. The height $h_0$ of the cylinder member 2 is set such that the top surface of the cylinder member 2 is slightly (approximately 0.5-1 mm) lower than the top surface of the rotary table 3 as shown in FIG. 2. When the cylinder member 2 reaches the level $h_0$, the MPU 100 sets the digital data $D_3$ to "0" in a step 208 and supplies it to the drive circuit 104 to stop the rotation of the motor $M_2$ The wafer is sucked from the cylinder member 2 onto the rotary table 3 while it is kept centered.

In a step 209, the digital data $D_1$ to rotate the motor $M_1$ in the forward direction at a high speed (for example, one revolution per second) is supplied to the DAC 102. As the rotation of the motor $M_1$ is started, the MPU reads in the digital data $D_8$ in a step 210, and in a step 211 it checks whether the digital data $D_8$ is logical "H" or not. The digital data $D_8$ may be read in by the interruption function of the MPU. If the digital data $D_8$ is not logical "H", the operation from the step 210 is repeated. If the digital data $D_8$ is logical "H", that is, if the notch NT is on the aperture 61a of the photo-electric element 60, the MPU reads in the digital data $D_2$ in a step 212 and stores it in a predetermined memory. In a step 213, the MPU sets the digital data $D_1$ to "0" and supplies it to the DAC 102. As a result, the drive circuit 101 dynamically brakes the motor $M_1$ to rapidly stop the rotation of the wafer. The water stops at a position at which the notch NT has slightly passed the aperture 61a, for example, at 5°-10° rotation angle of the wafer. In a step 214, the MPU supplies the digital data $D_1$ to the DAC 102 to rotate the motor $M_1$ in the backward direction at a low speed. Thus, the wafer is slowly rotated in the backward direction. In a step 215, the MPU reads in the digital data $D_2$ from the counter 103 and, in a step 216, it compares it with the data stored in the memory. If both are not equal, the operation is repeated from the step 215.

The counter 103 counts up during the forward rotation of the motor $M_1$ and counts during the backward rotation of the motor $M_1$. Since the motor $M_1$ forwardly overruns at the beginning of the step 215, the digital data $D_2$ is gradually decremented through the repetition of the steps 215 and 216 and it finally becomes equal to the data stored in the memory. Then, the MPU supplies the digital data $D_1$ "0" to the DAC 102 in a step 217 to rapidly stop the rotation of the motor $M_1$. The wafer stops at the position at which the notch NT is generally above the aperture 61a.

Figure 5C:
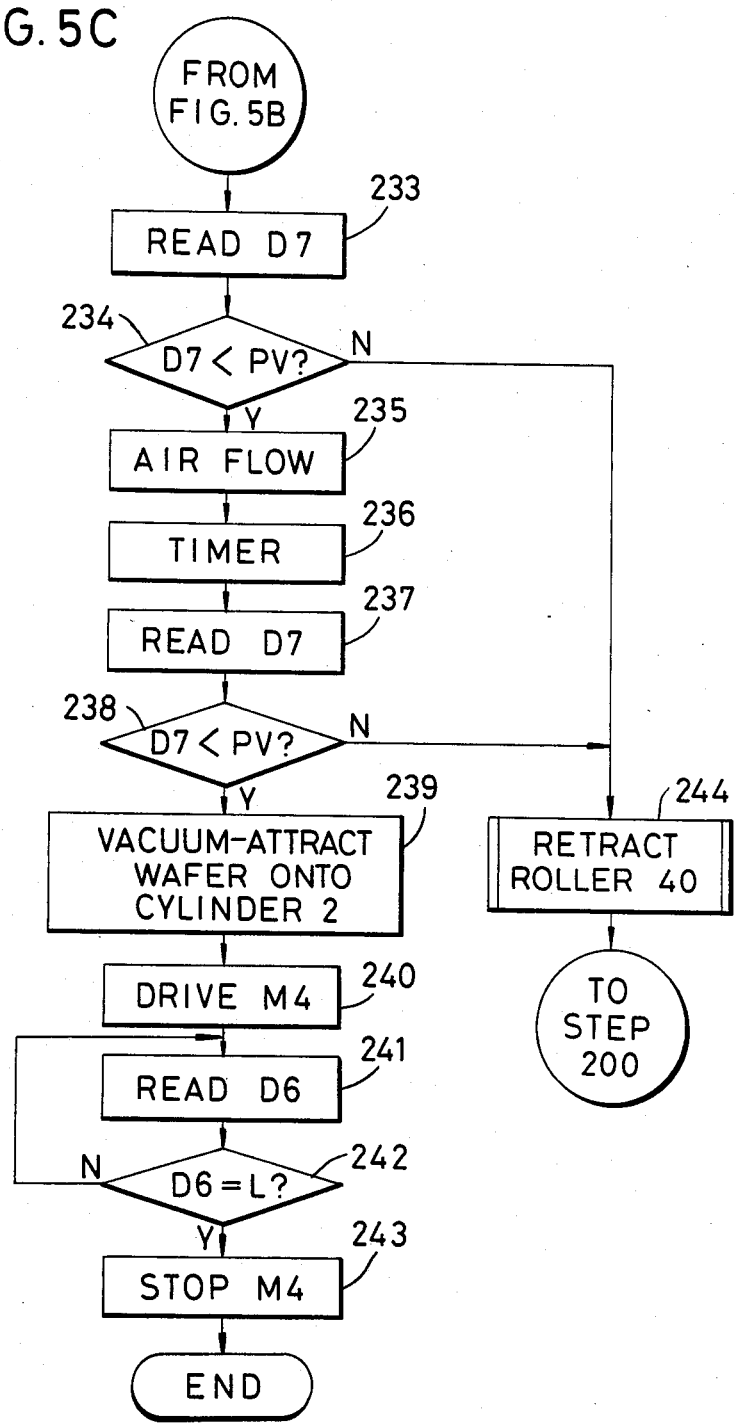

More precise positioning of the notch NT is carried out in the operation starting from a step 218 of FIG. 5B. The MPU reads in the digital data $D_9$ in the step 218, and in a step 219, it checks if it is "0" or not. Since the digital data $D_9$ represents the difference between the photo-electric signals from the two photo-sensitive elements 60a and 60b, the digital data $D_9$ is "0" when the notch NT is exactly positioned, as shown in FIG. 3A. If the center of the notch NT is offset to the photo-sensitive element 60a, the digital data $D_9$ is a positive value representing the offset, and if the center is offset to the photosensitive element 60b the digital data $D_9$ is a negative value representing the offset.

If the digital data is not "0" in the decision step 219, whether the digital data $D_9$ is positive or negative is checked in a step 220. If the digital data $D_9$ is positive, the motor $M_1$ is forwardly rotated at the low speed in a step 221 so that the digital data $D_9$ becomes zero. If the digital data $D_9$ is negative, the motor $M_1$ is backwardly rotated at the low speed in a step 222. After the step 221 or 222, the operation is repeated from the step 218. The loop of the steps 218-222 is completed in a very short time because the rotation angle of the wafer is less than that corresponding to the width of the notch NT, at most.

If the digital data $D_9$ is zero in the decision step 219, the MPU supplies the digital data $D_1$ "0" to the DAC 102 in a step 223. Thus, the motor $M_1$ is stopped and the notch NT is positioned as shown in FIG. 3A. In a step 224, the suction operation of the rotary table 3 is released in a step 224 and the suction operation of the cylinder member 2 is started. In a step 225, the MPU generates a data "UP" as the digital data $D_3$ to move up the cylinder member 2 and supplies it to the drive circuit 104. Thus, the rotation of the motor M$_2$ is started and the cylinder member 2 starts to move up.

In a step 226, the MPU reads in the digital data D$_4$. In a step 227, the MPU checks if the digital data D$_4$ is equal to the level h$_1$, that is, if the mount surface of the cylinder member 2 is 0.5–1 mm higher than the mount surface of the rotary table 3. If D$_4$=h$_1$, the MPU sets the digital data D$_3$ to "0" in a step 228 to stop the rotation of the motor M$_2$. At this position, the wafer is vacuum-sucked to the cylinder member 2 while it is slightly floated from the rotary table 3. The position of the notch NT may be slightly shifted during the delivery operation.

In a step 229, the MPU sets the digital data D$_5$ to logical "H" and supplies it to the drive circuit 106 to start the rotation of the motor M$_4$ (in the clockwise direction in FIG. 1). After the timing plate 49 interrupts the photo-electric sensor 50 as the motor M$_4$ is rotated, the MPU reads in the digital data D$_6$ in a step 230, and in a step 231, it checks if the data is logical "H" or not. If D$_6$="H" is false, the operation is repeated from the step 230. Since the timing plate 49 is semi-circular, the light is irradiated again to the photo-electric sensor 50 as the motor M$_4$ is rotated by one-half revolution from the position of FIGS. 1 and 2. In a step 231, the MPU determines that D$_6$="H" is true, and in a step 232, it sets the digital data D$_5$ to logical "L" and supplies it to the drive circuit 106 to stop the rotation of the motor M$_4$. As a result, the slide member 41 is moved toward the wafer, and the pushing roller 40 finally abuts against the wafer as shown in FIG. 3C or 3B. Since the wafer is sucked onto the cylinder member 2, the slide member 41 does not move after the pushing roller 40 abuts against the wafer, and the roller 48 which is rotated as the motor M$_4$ rotates moves away from the cam 41a and is positioned at the leftmost end of FIG. 2. Accordingly, the pushing roller 40 pushes the wafer toward the center thereof only by the biasing force of the spring 46.

In a step 233, the MPU 100 reads in the digital data D$_7$, and in a step 234, it checks if the data is lower than a predetermined level PV. Since the digital data D$_7$ represents the magnitude of the photo-electric signal from the photo-electric sensor 62, it is of a small value when the pushing roller 40 fits in the notch NT as shown in FIG. 3C, and it is of a large value when the pushing roller 40 abuts against the circumferential edge of the wafer as shown in FIG. 3B. Accordingly, in FIG. 3C, the MPU determines that the step 234 is true, and in a step 235, it switches the suction operation of the cylinder member 2 to the air—flow operation. As the suction of the wafer is released, the wafer is moved by the pushing force of the pusing roller 40 to abut against the two reference rollers 30 and 31. Accordingly, only the slide member 41 and the spring 46 act as the control means in the present operation.

As seen from FIG. 1, the rollers 30 and 31 are symmetrically arranged with respect to a line passing through the center of the wafer W$_2$ and the pushing roller 40, and an angle made by lines connecting the abutting points of the two rollers 30 and 31 and the center of wafer W$_2$, respectively, is approximately 90 degrees. Thus, the wafer is uniquely positioned to the position determined by the arrangement of the rollers 30 and 31 while the pushing roller 40 fits into the notch NT. The MPU waits in a timer routine of a step 236 until the wafer is positioned while it is pushed. In a step 237, it again reads in the digital data D$_7$ and in a step 238 checks if the data is smaller than the predetermined value PV. If it is smaller, it means that the wafer was positioned while the pushing roller 40 fitted to the notch NT. Thus, in a step 239, the vacuum suction operation of the cylinder member 2 is started.

In a step 240, the MPU sets the digital data D$_5$ to logical "H" to rotate the motor M$_4$, and in a step 241, it reads in the digital data D$_6$. In a step 242, it checks whether the data is logical "L" or not. If D$_6$="L" is false, the operation is repeated from the setp 241. If D$_6$="L" is true, it means that the motor M$_4$ (timing plate 49) has been rotated one-half revolution, and the MPU sets the digital data D$_5$ to logical "L" in a step 243 to stop the rotation of the motor M$_4$. The pushing roller 40 is retracted from the position at which it fits in the notch NT to the initial position (shown in FIGS. 1 and 2) through the steps 240–243.

Through the above operation, one wafer has been positioned. If the steps 234 and 238 indicate that the data is not smaller than the predetermined level, the pushing roller is retracted in a step 244 (identical to the steps 240–243), and the operation is repeated from the step 200.

In the present embodiment, since the photoelectric sensor 60 and the pushing roller 40 are arranged on the path of movement of the slide member 41, the pushing roller 40 can be moved out immediately after the rotation positioning of wafer by the photo-electric sensor 60 so that the reduction of the throughput is prevented. Since the photo-electric sensor 62 is arranged on the slide member 41 and is always kept in the predetermined positional relationship to the slide member 41, the positional relationship need not be changed even if the wafer diameter changes, because the position of the circumferential edge which goes in and out of the aperture of the photo-electric sensor 62 is not essentially affected by the wafer diameter at the position close to the pushing roller 40.

The operation of the present embodiment has thus been described. Other modifications may be used in the sequence of FIG. 5. For example, after the step 217, the steps 218–223 may be omitted and the step 224 may be immediately carried out. To this end, it is necessary that the positioning precision is sufficently high when the motor M$_1$ is rapidly stopped in the step 217. If this is attained, the photo-electric sensor 60 may be the photo-electric element having one photo-electric surface, and the subtractor 113 and the ADC 115 may be omitted If it is determined in the step 234 that the pushing roller 40 exactly fits in the notch NT, the pushing roller 40 may be retracted before the step 235 to an extent that the pushing roller 40 is kept fitted in the notch NT, and the pushing roller 40 is again moved out after the execution of the step 235 to press the notch NT of the wafer, and then the step 236 is executed. After the step 228, the cylinder member 2 may be switched to the air-flow, the pushing roller 40 is moved out so that the wafer is directly pushed by the rollers 30 and 31 for positioning, and the status of the positioning may be checked by the photo-electric signal of the photo-electric sensor 62. More specifically, after the step 228, the steps 235, 229, 230, 231, 232, 236–244 are sequentially executed. In this manner, the throughput is further improved.

The jumping to the step 244 after the step 234 or 238 means that the operation is repeated from the wafer centering step. Thus, if the shape of the notch NT is broken for some reason or if the notch NT is normal but there is a mechanical trouble, the operation may be repeated endlessly. Accordingly, if the step 244 is executed three times, the operation of the apparatus may be stopped by an error routine or the wafer may be unloaded. Alternatively, clocking may be started from the start point (step 200) of the wafer positioning operation and the occurrence of error may be determined if the time count is sufficiently larger than the time required to complete the normal positioning and the step 244 has been executed at least one time.

Figure 6:
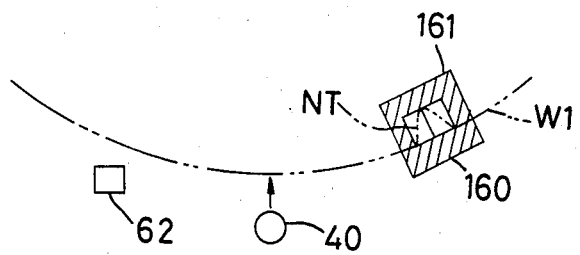
FIG. 6 is a plan view of another embodiment of the photo-electric sensor for detecting the notch.

Modifications may be made in the construction of the present embodiment. For example, the photoelectric sensor 60 for detecting the notch NT need not be arranged on the slide member 41 but it may be fixed to the base plate 1. In this case, if the photo-electric sensor 60 is on the same side as the pushing roller 40, it mechanically interferes as the pushing roller 40 is moved out. Accordingly, the photo-electric sensor 60 is arranged as shown in FIG. 6, in which a photo-electric sensor 160 and a mask 161 are deviated rightward from the pushing roller 40 by a small rotation angle. In this case, it is necessary to rotate the wafer $W_1$ to detect the notch NT, and after the positioning shown in FIG. 6, rotate the motor $M_1$ by the rotation angle corresponding to the clockwise deviation of the wafer $W_1$. In the arrangement shown in FIG. 6, if the wafer suction force of the rotary table 3 is strong, the pushing roller 40 and the photo-electric sensor 62 are driven out after the notch NT has been positioned as shown in FIG. 6 and the wafer (motor $M_1$) is rotated clockwise at the low speed while the circumferential edge of the wafer is pushed by the pushing roller 40 by the biasing force of the spring 46, and the motor $M_1$ is rapidly stopped when the photo-electric signal of the photo-electric sensor 62, that is, the digital data $D_7$ becomes lower than the predetermined level so that the pushing roller 40 is fitted into the notch NT.

The photo-electric sensor 62 need not be arranged on the slide member 41 but the movement position of the slide member 41 may be detected by a linear encoder or a potentiometer. In this case, the photoelectric sensor 60 for detecting the notch NT is arranged as shown in FIGS. 1 and 2, and after the centering, if absence of the notch NT is detected by the photo-electric sensor 60, the slide member 41 is driven out. The drive position $P_1$ of the slide member 41 at which the pushing roller 40 abuts against the circumferential edge of the wafer is stored, and the pushing roller 40 is retracted. After the positioning by the rotation of the wafer, the pushing roller 40 again pushes the wafer, and it is checked whether the drive position of slide member 41 is equal to the stored position $P_1$ or different therefrom by the distance corresponding to the fitting of the pushing roller in the notch NT.

In the present embodiment, the pushing roller 40 is arranged on the slide member which linearly moves toward the center of the wafer. Alternatively, it may be arranged, together with the photo-electric sensor 62, at an end of an arm which is arcuately rotated with a large radius.

In the circuit shown in FIG. 4, the pulse converter PC and the counter 103 for detecting the rotation angle of the motor $M_1$ may be omitted. In this case, it is necessary to configure the drive circuit 101 such that the output signal of the subtraction circuit 113 is directly supplied to the drive circuit 101 and the motor $M_1$ is servocontrolled to render the output signal zero and keep a constant rotation speed. The motor $M_1$ is rotated at the high speed to detect the notch and then the motor $M_1$ is rapidly stopped. Then, the motor $M_1$ is reversely rotated at the low speed and the digital data $D_9$ from the ADC 115 is read. When the difference between the photo-electric signals from the photo-electric elements 60a and 60b becomes larger than a predetermined value 1 when a portion of the notch overlies on the aperture 61a, the rotation of the motor $M_1$ is stopped. Then, the drive circuit 101 is switched to the servo control and the motor $M_1$ is driven to cause the difference of the photo-electric signals of the photo-sensitive elements 60a and 60b to be zero. A predetermined time after the start of the servo drive of the motor $M_1$, the center of the notch NT comes to the boundary of the photo-sensitive elements 60a and 60b. Then, the final positioning is effected by the pushing roller 40.

What we claim is:

1. A positioning apparatus for positioning a circular substrate having a V-shaped or U-shaped notch in a circumferential edge thereof, comprising:
   rotation means for mounting said substrate and rotating said substrate around a center axis corresponding to a center of curvature of said substrate;
   a pushing member arranged outside of the circumferential edge of said substrate in the same plane as said substrate and adapted to be fitted into said notch;
   a notch sensor responsive to the notch of said substrate rotated by said rotation means;
   means for stopping the rotation of said substrate in response to said notch sensor at a position at which the notch faces said pushing member;
   means for moving said pushing member toward said center axis to displace said substrate along said plane by said pushing member acting through the notch of said substrate stopped by said rotation stopping means;
   positioning means arranged to face said pushing member on the opposite side of said substrate in the same plane as said substrate mounted on said rotation means and adapted to abut against the circumferential edge of said substrate displaced by said pushing member to position said substrate; and
   means for detecting the fitting of said pushing member in the notch of said substrate, said detecting means including discrimination means for discriminating a first status in which the pushing member is fitted in the notch and a second status in which said pushing member abuts against the circumferential edge of said substrate other than the notch, said discrimination means including a photo-electric detector arranged at a predetermined distance from said pushing member and movable with said pushing member for photo-electrically detecting the circumferential edge of said substrate to produce outputs of different levels for said first status and said second status.

2. A positioning apparatus according to claim 1, wherein said photo-electric detector is arranged in the proximity of said pushing member.

3. A positioning apparatus according to claim 1, wherein said photo-electric detector includes means for irradiating a light flux on one side of said substrate including an area of the circumferential edge of said substrate, and a photo-sensor arranged on the other side of said substrate to be movable across the circumferential edge of said substrate.

4. A positioning apparatus according to claim 1, wherein said notch sensor includes a photo-electric detector arranged to face the circumferential edge of said substrate.

5. A positioning apparatus according to claim 4, wherein said photo-electric detector of said notch sensor is arranged at a predetermined distance from said pushing member and movable with said pushing member.

6. A positioning apparatus according to claim 1, wherein said moving means moves said pushing member in a radial direction with respect to said center axis and said notch sensor is arranged on a line connecting said pushing member and said center axis.

* * * * *